(12) United States Patent
Shindo et al.

(10) Patent No.: US 6,203,627 B1
(45) Date of Patent: Mar. 20, 2001

(54) CLEANING METHOD

(75) Inventors: Naoki Shindo, Kurume; Shigenori Kitahara, Chikugo; Hironobu Hyakutake, Tosu, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/291,970

(22) Filed: Apr. 15, 1999

(30) Foreign Application Priority Data

Apr. 16, 1998 (JP) .......................................... 106374
Dec. 18, 1998 (JP) .......................................... 360429

(51) Int. Cl.[7] ................. B08B 3/04; B08B 3/08
(52) U.S. Cl. .................... 134/18; 134/26; 134/57 R; 134/57 D
(58) Field of Search .................... 134/18, 2, 26, 134/57 R, 57 D (56) References Cited

FOREIGN PATENT DOCUMENTS

03257452 * 11/1991 (JP) .
06271859 * 9/1994 (JP) .

* cited by examiner

*Primary Examiner*—Zeinab El-Arini
(74) *Attorney, Agent, or Firm*—Smith, Gambrell & Russell, LLP (57) ABSTRACT

A cleaning method for cleaning, an object to be, processed. The object is cleaned by immersing the object into a cleaning liquid within a processing tank. The cleaning method includes the steps of: detecting the temperature of the cleaning liquid in which the object to be processed is immersed or to be immersed, and generating a corresponding temperature signal; determining an immersion time for the immersion of the object in the cleaning liquid, based on the temperature signal; and immersing the object to be processed in the cleaning liquid, for the immersion time.

13 Claims, 7 Drawing Sheets

CLEANING METHOD

BACKGROUND OF THE INVENTION

1. Technical Field

The present invention relates to a cleaning method and a cleaning apparatus wherein an object to be processed, such as a semiconductor wafer or a glass substrate for an LCD, is immersed in a cleaning liquid and a rinse liquid and cleaned.

2. Description of Related Art

A cleaning method that is widely used during the process of manufacturing semiconductor devices generally involves immersing objects to be processed, such as semiconductor wafers or glass substrates for LCDs (hereinafter called "wafers"), sequentially into a series of cleaning tanks, each filled with a chemical (processing liquid) such as ammonia water ($NH_4OH$) or hydrofluoric acid (HF) or a rinse liquid such as distilled water or ozone water, to clean them.

A so-called one-path type of apparatus is known in the art as one form of this cleaning apparatus, wherein a rinse liquid (such as distilled water or ozone water) and a dilute liquid (for example, diluted hydrofluoric acid (DHF) including a rinse liquid and a chemical) such as hydrofluoric acid (HF) are supplied in turn in the same processing tank, and a wafer or the like is immersed within this rinse liquid and diluted liquid for a predetermined time to clean it. With this cleaning apparatus, a dilute liquid (such as DHF) comprising a predetermined quantity of a chemical mixed into a rinse liquid is poured into the processing tank and the wafer or the like is immersed in this dilute liquid (DHF), or the dilute liquid is supplied into the processing tank after the wafer or the like has been accommodated therein, whereby an etching type of "cleaning" can be performed to remove particles adhering to the surfaces of the wafer or to remove metals such as Ni and Fe or natural oxide films that have adhered physically or chemically thereto. The wafer is subsequently immersed in rinse liquid that is supplied to the processing tank, so that any chemical adhering to the wafer surfaces can be removed.

In th is prior-art type of cleaning apparatus, the time during which the wafer or the like is immersed and processed in the cleaning liquid is constant, so that if the temperature of the cleaning liquid within the processing tank changes, the wafer processing capability thereof will also change. With cleaning (etching) by DHF, for example, a problem occurs in that the etching characteristics will change, so that the cleaning capability and the cleaning precision thereof will deteriorate.

The present invention was devised in the light of the above situation and has as an object thereof the provision of a cleaning method and apparatus wherein control of processing time is based on the temperature of the cleaning liquid, thereby enabling improvements in cleaning capability and cleaning precision.

SUMMARY OF THE INVENTION

In order to achieve the above object, the present invention provides a cleaning method for immersing an object to be processed in to a cleaning liquid within a processing tank and cleaning the object therein, wherein this cleaning method comprises the steps of: detecting the temperature of the cleaning liquid in which the object to be processed is immersed or to be immersed, and generating a corresponding temperature signal; determining an immersion time for the immersion of the object in the cleaning liquid, based on the temperature signal; and immersing the object to be processed in the cleaning liquid, for the immersion time.

The present invention also provides a cleaning method for immersing an object to be processed into a cleaning liquid within a processing tank and cleaning the object therein, this cleaning method being such as to comprise a chemical supply timeband during which a chemical is supplied into the processing tank to gradually increase the concentration of the chemical in the cleaning liquid and an immediately subsequent stabilized concentration timeband; wherein the cleaning method comprises the steps of: detecting the temperature of the cleaning liquid in which the object is immersed or to be immersed, and generating a corresponding temperature signal; rectifying the length of the chemical supply timeband, based on the temperature signal; and immersing the object to be processed in the cleaning liquid, for an immersion time that comprises the rectified chemical supply timeband length.

The present invention further provides a cleaning method for immersing an object to be processed into a cleaning liquid within a processing tank and cleaning the object therein, this cleaning method being such as to comprise a chemical supply timeband during which a chemical is injected into the processing tank to gradually increase the concentration of the chemical in the cleaning liquid and an immediately subsequent stabilized concentration timeband; wherein the cleaning method comprises the steps of: detecting the temperature of the cleaning liquid in which the object is immersed or to be immersed, and generating a corresponding temperature signal; rectifying the length of the stabilized concentration timeband, based on the temperature signal; and immersing the object to be processed in the cleaning liquid, for an immersion time that comprises the rectified stabilized concentration timeband length.

Even further, the present invention provides a cleaning method for immersing an object to be processed into a cleaning liquid within a processing tank and cleaning the object to be processed therein, this cleaning method being such as to comprise a chemical supply timeband during which a chemical is supplied into the processing tank to gradually increase the concentration of the chemical in the cleaning liquid and an immediately subsequent stabilized concentration timeband; wherein the cleaning method comprises the steps of: detecting the temperature of the cleaning liquid in which the object to be processed is immersed or to be immersed, and generating a corresponding temperature signal; predetermining a rectification time in accordance with the concentration ratio of a processing liquid, for each of a temperature that is greater than a reference temperature for the processing liquid and a temperature that is less than the reference temperature; rectifying the length of the chemical supply timeband by subtracting the rectification time from a reference time for a temperature given by the temperature signal that is greater than the reference temperature, or adding the rectification time to the reference time for a temperature given by the temperature signal that is less than the reference temperature; predetermining a rectification coefficient in accordance with the concentration ratio of the processing liquid, for each temperature of the processing liquid; rectifying the length of the stabilized concentration timeband by multiplying a reference time for the stabilized concentration timeband by a rectification coefficient corresponding to the temperature given by the temperature signal; and immersing the object in the cleaning liquid, for an immersion time that comprises the rectified chemical supply timeband length and the rectified stabilized concentration timeband length.

Furthermore, the present invention provides a cleaning method for immersing an object to be processed into a cleaning liquid within a processing tank and cleaning the object to be processed therein, wherein this cleaning method comprises the steps of: detecting the temperature of the cleaning liquid in which the object is immersed or to be immersed, and generating a corresponding temperature signal; predetermining a rectification coefficient in accordance with the concentration ratio of a processing liquid, for each of a temperature that is greater than a reference temperature for the processing liquid and a temperature that is less than the reference temperature; determining the value of a rectification coefficient, based on the value of the temperature signal; rectifying by multiplying an immersion time for the immersion of the object in the cleaning liquid by the value of the rectification coefficient based on the value of the temperature signal; and immersing the object in the cleaning liquid, for precisely the rectified immersion time.

Yet further, the present invention provides a cleaning apparatus comprising a processing tank for accommodating an object to be processed, a chemical supply source, a rinse liquid supply source, a chemical supply pipeline connecting the processing tank to the chemical supply source, and a rinse liquid supply pipeline connecting the processing tank to the rinse liquid supply source, wherein this cleaning apparatus further comprises: temperature detection means for detecting the temperature of a chemical and/or a rinse liquid in which the object is immersed or to be immersed, and generating a corresponding temperature signal; flow-rate adjustment means provided in the chemical supply pipeline and the rinse liquid supply pipeline; and control means for controlling the flow-rate adjustment means on the basis of the temperature signal.

DESCRIPTION OF THE PREFERRED EMBODIMENT

Embodiments of the present invention will be described below, with reference to the accompanying drawings. This embodiments are described as applications to a cleaning system for semiconductor wafers, by way of example.

Figure 1:
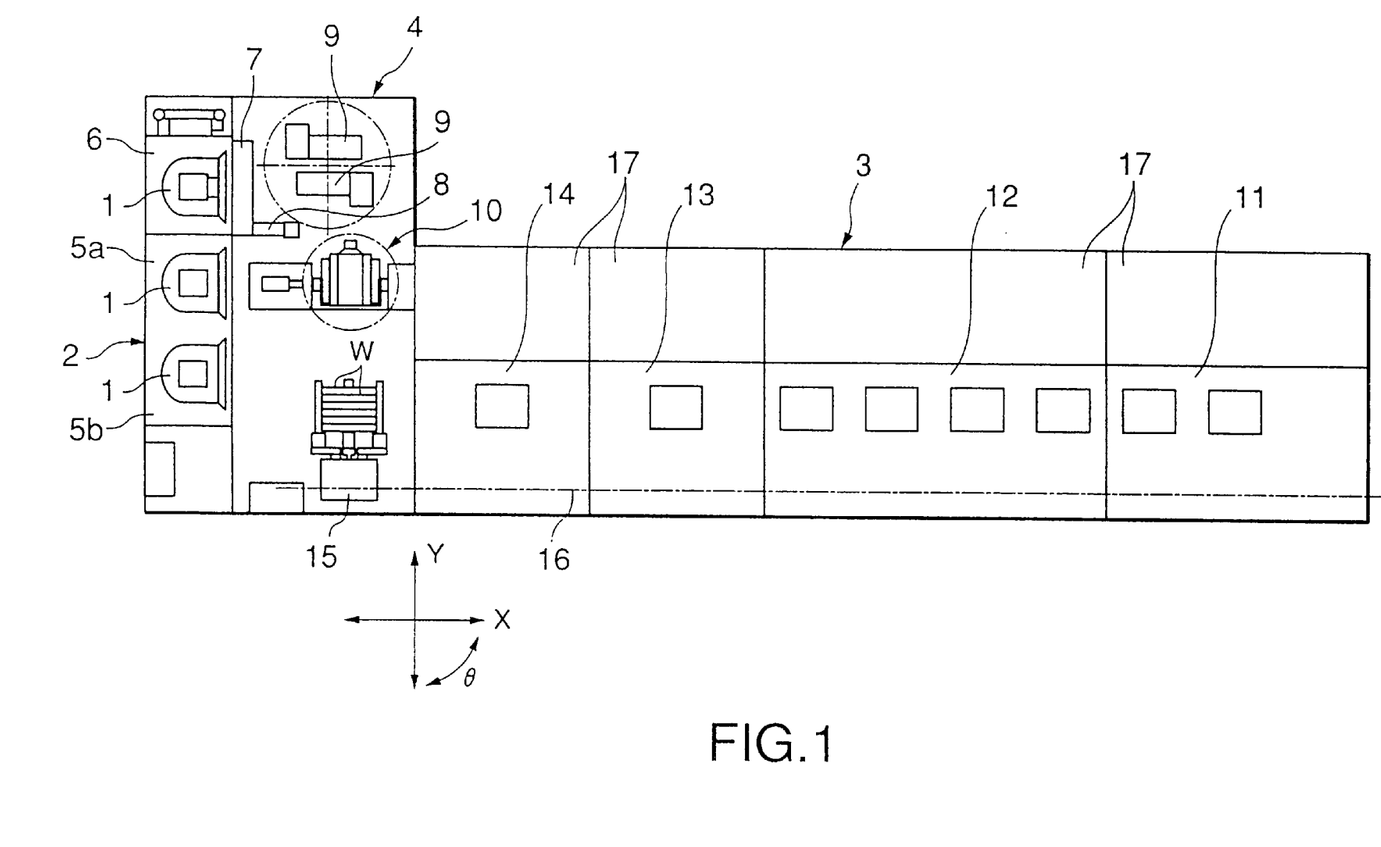
FIG. 1 is a schematic plan view of a cleaning system using the cleaning apparatus of this invention.

A schematic plan view of an example of a cleaning system for semiconductor wafers, to which the cleaning apparatus of this invention is applied, is shown in FIG. 1.

The above mentioned cleaning system is mainly configured of a conveyor portion 2 for conveying containers such as carriers 1 into and out of the system, where each carrier 1 contains substrates to be processed such as semiconductor wafers W (hereinafter called "wafers") in a horizontal state; a processing portion 3 for processing the wafers W with chemicals or cleaning fluids and also drying them; and an interface portion 4 located between the conveyor portion 2 and the processing portion 3, for receiving the wafers W, adjusting the positions thereof, and changing the attitudes thereof.

The conveyor portion 2 is provided with a carrier inlet portion 5a and a carrier outlet portion 5b together with a wafer reception portion 6, aligned along one side edge portion of the cleaning system. In this case, the configuration is such that a conveyor mechanism (not shown in the figure) is arranged between the carrier inlet portion 5a and the wafer reception portion 6, and carriers 1 are conveyed from the carrier inlet portion 5a to the wafer reception portion 6 by this conveyor mechanism.

A carrier lifter (not shown in the figure) is disposed in each of the carrier outlet portion 5b and the wafer reception portion 6, with the configuration being such that empty carriers 1 can be transferred by these carrier lifters into a reception portion of a carrier standby portion (not shown in the figure) provided above the conveyor portion 2, and out of the carrier standby portion. A carrier transfer robot (not shown in the figure) that is capable of horizontal movement (in the X and Y directions) and vertical movement (in the Z direction) is disposed in the carrier standby portion, with the arrangement being such that empty carriers 1 transferred out of the wafer reception portion 6 are aligned and also transferred out to the carrier outlet portion 5b by this carrier transfer robot. It is also possible to place not only empty carriers but also carriers 1 containing wafers W within this carrier standby portion.

The wafer reception portion 6 opens into the interface portion 4, and a lid-opening mechanism 7 is disposed in the aperture portion thereof. The configuration is such that the lid members (not shown in the figure) of the carriers 1 are opened and closed by this lid-opening mechanism 7. The lid member of a carrier 1 containing unprocessed wafers that has been conveyed into the wafer reception portion 6 can therefore be removed by the lid-opening mechanism 7 so that the wafers W can be conveyed out of the carrier 1, and, once all of the wafers W have been transferred, the lid member can be closed again by the lid-opening mechanism 7. In a similar manner, the lid member of an empty carrier 1 that has been conveyed into the wafer reception portion 6 from the carrier standby portion can be removed by the lid-opening mechanism 7 so that wafers W can be conveyed into the carrier 1, and, once all of the wafers W have been transferred, the lid member can be closed again by the lid-opening mechanism 7. Note that a mapping sensor 8 for detecting the number of wafers W accommodated within each carrier 1 is disposed in the vicinity of the aperture portion of the wafer reception portion 6.

Within the interface portion 4 are disposed a wafer transfer arm 9 for holding a plurality of wafers W, such as 25 wafers W, in a horizontal state and also transferring them in that horizontal state to and from the carrier 1 in the wafer reception portion 6; a pitch changer (not shown in the figure) for holding a plurality of wafers W, such as 50 wafers W, at a predetermined spacing, but in a vertical state; an attitude modification device 10 positioned between the wafer transfer arm 9 and the pitch changer, for changing the attitude of a plurality of wafers W, such as 25 wafers W, from a horizontal state to a vertical state; and a position detection means such as a notch aligner (not shown in the figure) for detecting notches (not shown in the figure) provided in wafers W that have been adjusted to a vertical state. A conveyor path 16 linked to the processing portion 3 is also provided in the interface portion 4, and a wafer conveyor means such as a wafer conveyor chuck 15 is disposed in a freely movable manner on this conveyor path 16.

The processing portion 3 comprises a first processing unit 11 for removing particles and organic contaminants adhering to the wafers W, a second processing unit 12 for removing metal contaminants adhering to the wafers W, a cleaning/drying unit 13 for removing oxide films adhering to the wafers W and also drying the wafers W, and a chuck cleaning/drying unit 14 for cleaning and drying a wafer conveyor chuck 15, all of these components being arrayed in a line. The cleaning apparatus of this invention is used in the first and second processing units 11 and 12 and the cleaning/drying unit 13. Note that the previously mentioned wafer conveyor chuck 15 is disposed along the conveyor path 16 that is provided corresponding to the units 11 to 14, in such a manner that it is capable of movement in the X and Y directions (horizontal directions), the Z direction (the vertical direction), and the θ direction (a rotational direction). A chemical tank and a storage portion 17 containing piping and various vessels are constructed at each of positions corresponding to the units 11 to 14, on the side thereof opposite to the conveyor path 16.

The description now turns to the processing or cleaning apparatus in accordance with this invention.

Figure 2:
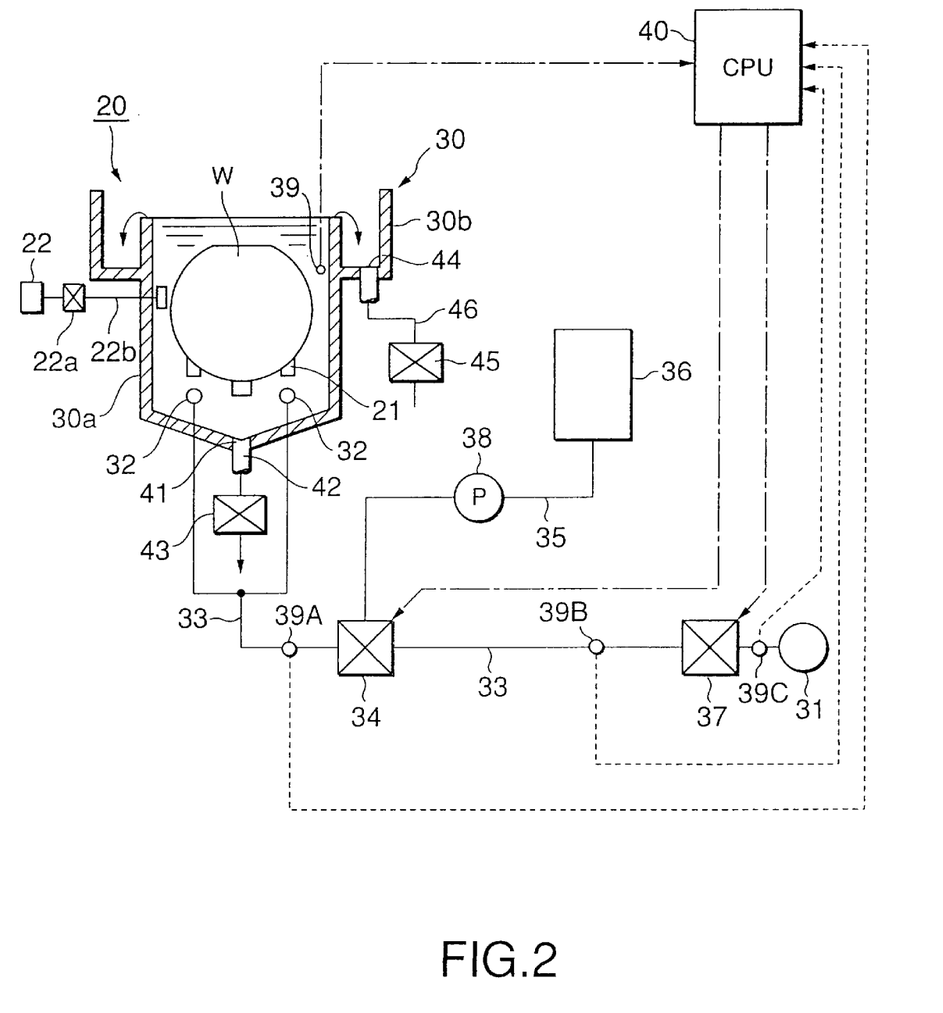
FIG. 2 is a schematic sectional view of an embodiment of the cleaning apparatus of this invention.
Figure 3:
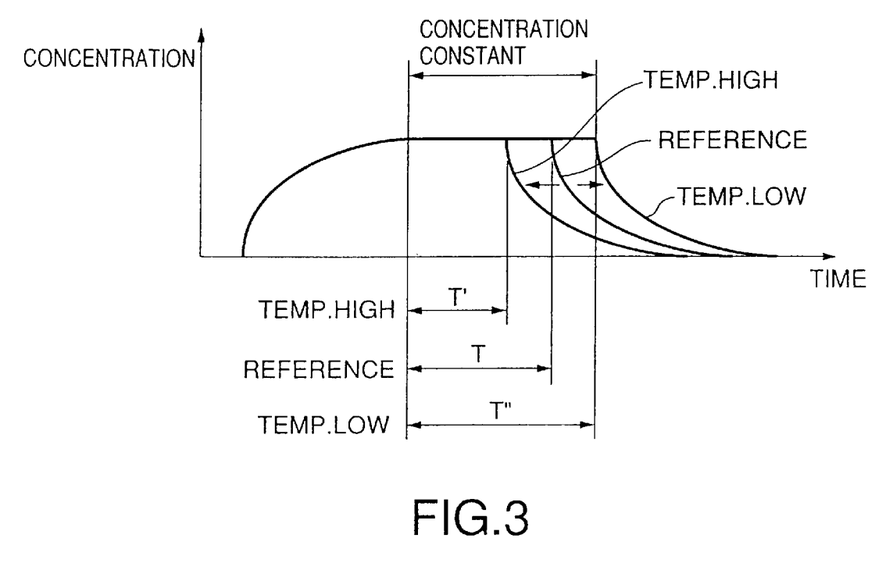
FIG. 3 is a graph of the relationship between processing liquid concentration and time, to illustrate the basic concept of rectification by the cleaning method of the present invention.

A schematic section through a typical embodiment of the cleaning apparatus of this invention is shown in FIG. 2. This cleaning apparatus 20 is provided with a processing tank 30 filled with a cleaning liquid {such as hydrofluoric acid (HF) in diluted form (DHF) or a rinsing liquid such as distilled water}, and an object to be processed such as a semiconductor wafer w (hereinafter called a "wafer W") is immersed in the dilute hydrofluoric acid (DHF) or rinsing liquid to clean the surfaces thereof. Washing liquid supply means such as cleaning liquid supply nozzles 32 are provided within this processing tank 30 to supply the cleaning liquid into the processing tank 30. The apparatus is also provided with a rinse liquid supply pipeline such as a distilled water supply pipeline 33, connected between the cleaning liquid supply nozzles 32 and a rinse liquid supply source such as a distilled water source 31; a chemical supply pipeline such as an HF supply pipeline 35, connected by a switching valve 34 to the distilled water supply pipeline 33; and an HF supply tank 36 acting as a chemical supply source, connected by the HF supply pipeline 35 to the cleaning liquid supply nozzles 32. In addition, an adjustment valve 37 that is capable of adjusting the flow rate (hereinafter called a "flow-rate adjustment valve") is provided on the distilled water source 31 side of the distilled water supply pipeline 33, and a pump 38 acting as a chemical supply means is provided in the HF supply pipeline 35.

A temperature sensor 39 acting as a temperature detection means is disposed within the processing tank 30, to detect the temperature of the cleaning liquid, such as DHF, that is supplied to the processing tank 30 to fill it. A temperature signal from this temperature sensor 39 is sent to a central processing unit (CPU) 40 that is a control means, and the arrangement is such that control signals obtained by comparison with information that is previously stored in the CPU 40 are sent to the flow-rate adjustment valve 37 and the switching valve 34 to adjust the supply times of the distilled water and HF.

Instead of disposing the temperature sensor 39 within the processing tank 30 to detect the temperature of the cleaning liquid such as DHF in the processing tank 30, the configuration could be such that the temperatures of the chemical (such as HF) and rinse liquid (such as distilled water) are detected before they are supplied to the processing tank 30, or that of the distilled water alone is detected. More specifically, a temperature sensor 39A could be disposed in the distilled water supply pipeline 33 after the chemical (HF) and rinse liquid (distilled water) are mixed together (on the secondary side of the switching valve 34), or a temperature sensor 39B or 39C could be disposed in the distilled water supply pipeline 33 on the primary or secondary side of the switching valve 34.

This makes it possible to adjust the supply times of the diluted liquid which is a mixture of a chemical such as HF and a rinse liquid such as distilled water (DHF, where the ratio of HF to distilled water is 1:100), by detecting the temperature of the DHF that fills the processing tank 30 and also controlling the flow-rate adjustment valve 37 and the switching valve 34 on the basis of the thus detected temperature.

A switching means such as a switching valve 43 is provided in an exhaust pipeline 42 connected to an exhaust port 41 provided in a lower portion of the processing tank 30.

The processing tank 30 is also configured of an inner tank 30a filled with the cleaning liquid and an outer tank 30b covering the outer peripheral edge of an aperture portion of the inner tank 30a, and a drain pipeline 46 provided with a valve 45 is connected to an exhaust port 44 provided in a base portion of the outer tank 30b.

A wafer boat 21 that is capable of raising and lowering is disposed within the processing tank 30. This wafer boat 21 is configured in such a manner that it takes a plurality of wafers W, such as 50 wafers W, that have been transferred from the wafer conveyor chuck 15 and conveys them into the processing tank 30, then it conveys the processed wafers W upwards and once again transfers them to the wafer conveyor chuck 15. A resistivity meter 22 that measures the resistivity of the distilled water in the inner tank 30a of the processing tank 30 is connected by a discharge pipeline 22b provided with a valve 22a to the inner tank 30a, on the outer side of the upper portion of the processing tank 30. The resistivity meter 22 is configured so that the valve 22a is closed while a cleaning liquid (such as DHF) is being supplied into the processing tank 30.

The description now turns to the sequence of cleaning performed by the cleaning apparatus of the above configuration. First of all, before wafers W are introduced into the processing tank 30, the temperature of the cleaning liquid such as DHF accumulated within the processing tank 30 or to be supplied thereto, or that of distilled water to be supplied thereto, is detected by the temperature sensor 39 and is also monitored by the CPU 40.

The detected temperature is compared with prestored information within the CPU 40 to determine the time of the cleaning process, such as that of etching, and the flow-rate adjustment valve 37 and the switching valve 34 are operated by control signals from the CPU 40 so that a predetermined quantity of DHF at a predetermined concentration is supplied into the processing tank 30. Simultaneously therewith, the wafers W are introduced into the processing tank 30 and are set therein, and a cleaning process such as etching is performed thereon. After a predetermined cleaning process (etching) has been performed in this manner, the cleaning liquid (DHF) within the processing tank 30 is exhausted and distilled water is supplied to the processing tank 30 to perform a rinse, after which the wafers W are pulled up out of the processing tank 30 and the cleaning process ends.

A specific embodiment of the cleaning method of this invention will be described below.

This embodiment is targeted at etching variations caused by fluctuations in the temperature of the cleaning liquid, such as the rinse liquid (distilled water), {whether the temperature of the rinse liquid (distilled water) is greater or less than a reference temperature}, and has the objective of keeping the etching amount constant by controlling the processing time of the cleaning liquid, for example. As means of solving this problem, the situation at which the DHF concentration is constant is taken as a base point and the subsequent processing time is rectified.

Figure 4:
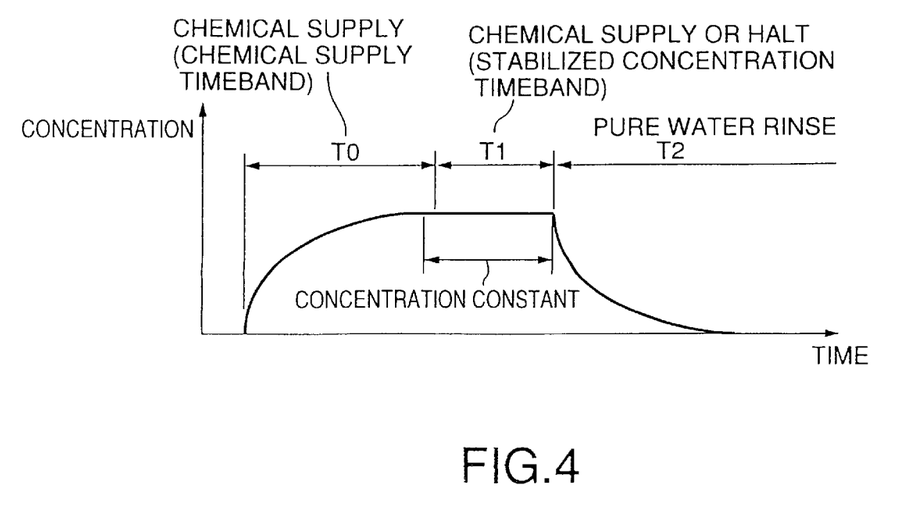
FIG. 4 is a graph of the relationship between processing liquid concentration and time, to illustrate specific details of the rectification method of the cleaning method of the present invention.

When it comes to rectifying the processing time, the cleaning time is divided into two parts, as shown in FIG. 4. The time during which the cleaning is performed can be divided into two parts: a "chemical supply timeband" during which the chemical is introduced into the processing tank and a "stabilized concentration timeband". In this case, the chemical supply timeband means the transitional timeband during which processing is performed, from the supply of the chemical and from a state at which the chemical concentration within the processing tank is substantially zero until it reaches a predetermined concentration. The stabilized concentration timeband means the timeband during which the processing is performed at a concentration that is substantially stable over the entire area (the predetermined concentration at which the wafer W is cleaned)—it does not matter whether the chemical is, or is not, introduced during this period. Since the chemical supply timeband and the stabilized concentration timeband are linked together smoothly, the chemical concentration within a region of the stabilized concentration timeband adjacent the chemical supply timeband is the same as the chemical concentration within the stabilized concentration timeband. In other words, a timeband during which the concentration is constant extends over the entire stabilized concentration timeband to part of the chemical supply timeband. In addition, a distilled or pure water rinse timeband means a timeband during which distilled water is supplied to the processing tank after the cleaning process is complete, to rinse the wafer W while lowering the concentration from the predetermined concentration.

The above rectification method consists of the following blocks:

(1) Rectification of the chemical supply timeband (the reference supply time T0 of the chemical, such as HF)
(2) Rectification of the stabilized concentration timeband (the supply or halt time T1 of the chemical, such as HF)

(1) Rectification of Chemical Supply Timeband

Figure 5:
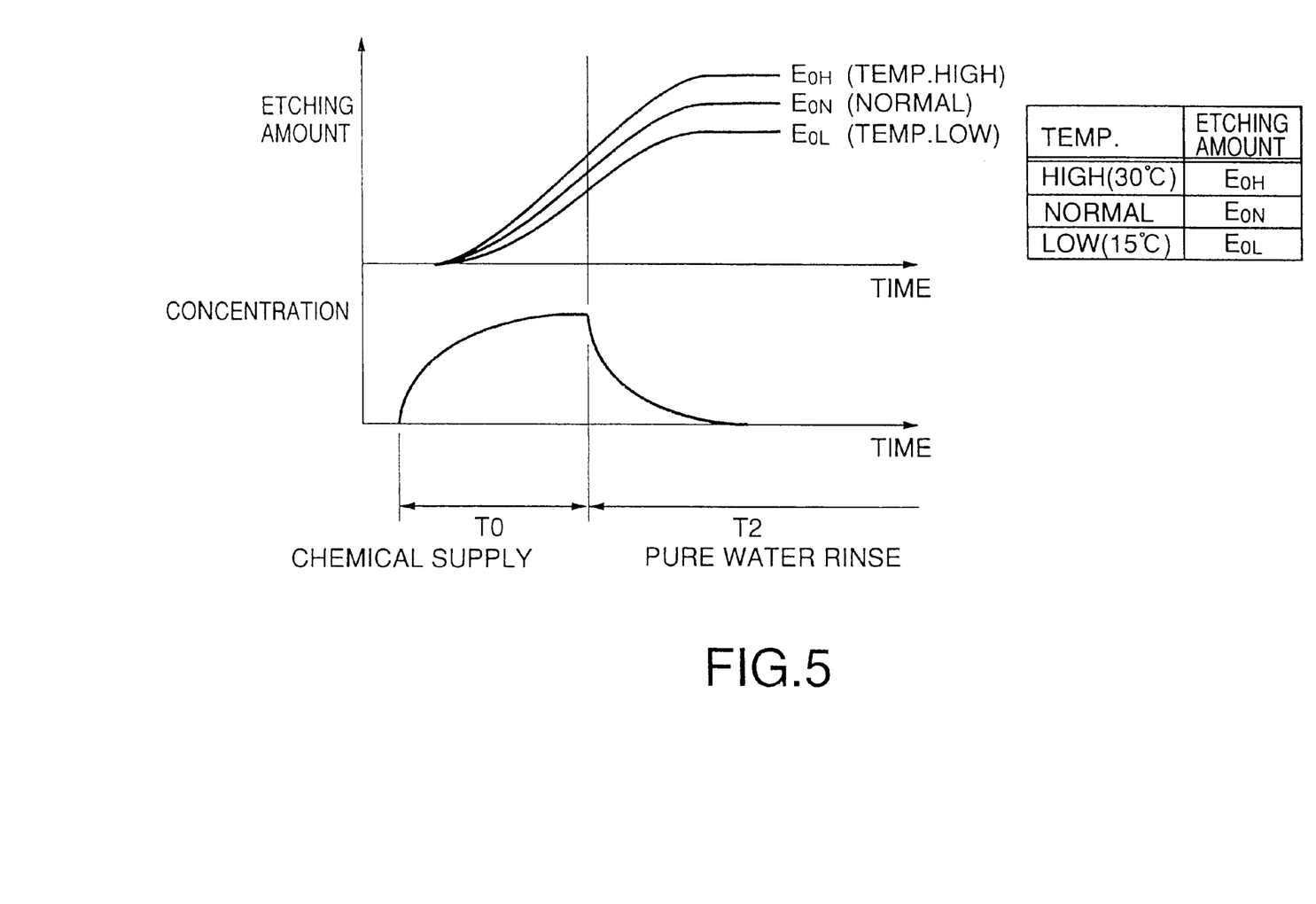
FIG. 5 is a graph of the relationships between etching amount, processing liquid concentration, and time, when no temperature-related rectification is performed for the chemical supply timeband.

If there is no such temperature rectification, variations will occur in the etching amount, as shown by the curves E0H to E0L in FIG. 5. In this case, if a reference temperature (such as 23° C.) is taken as normal and the etching amount at this reference temperature is assumed to be E0N, the rectification is performed such that the etching amount is always E0N, regardless of the actual temperature.

Figure 6:
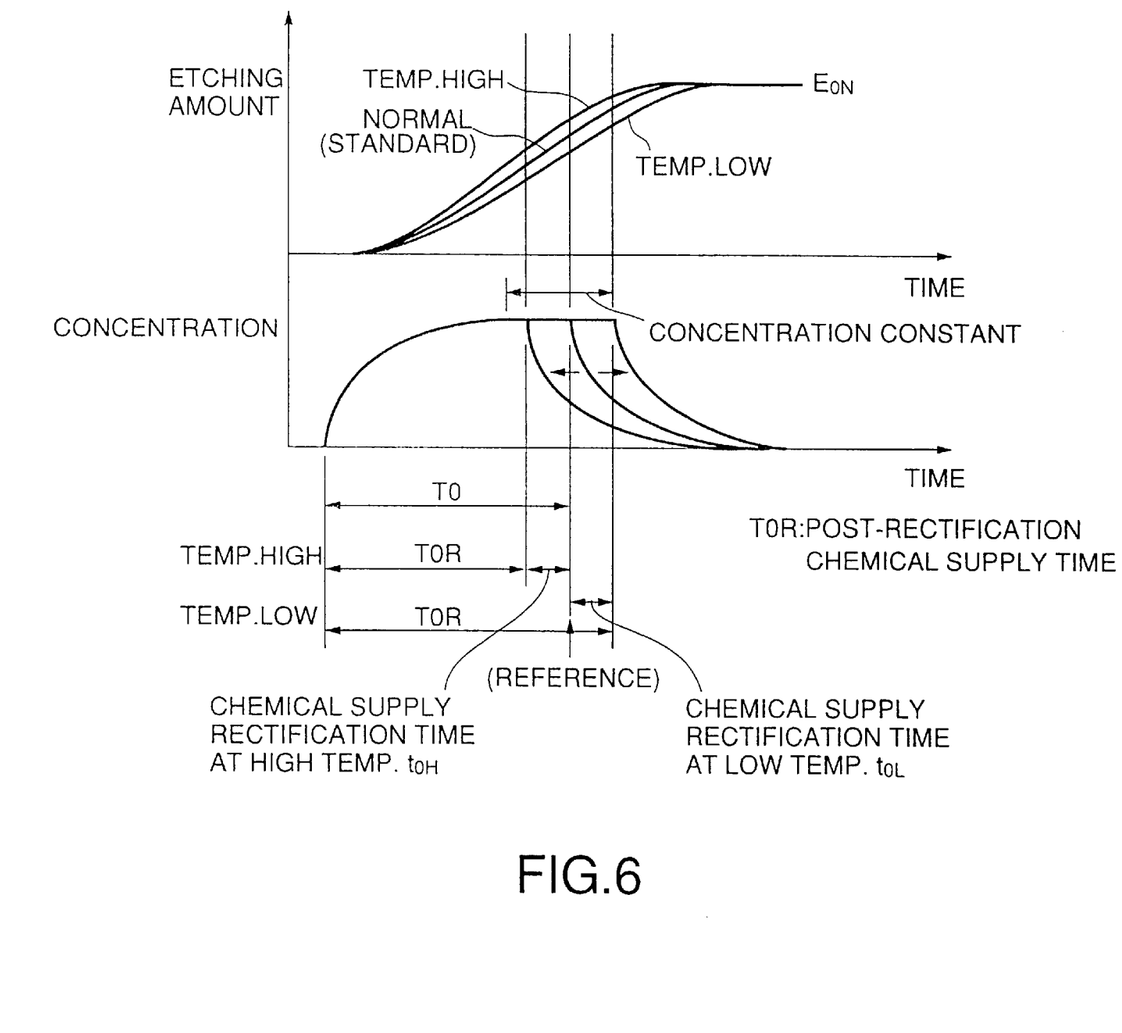
FIG. 6 is a graph of the relationships between etching amount, processing liquid concentration, and time, to illustrate rectification of the chemical supply timeband.

Therefore, if the detected temperature has fallen below the reference temperature, the processing time is extended until the etching amount is E0N. In other words, the processing time is rectified as shown in FIG. 6 and by the following equation:

$$T0R = T0 + t0L \qquad \text{(Equation 1)}$$

where T0R is the post-rectification chemical supply time (timeband) and t0L is a predetermined concentration ratio derived by previous experimentation, which gives chemical supply timebands for temperatures below the reference temperature (such as 23° C.), with respect to ratios of HF to distilled water of 1:200, 1:300, 1:400, 1:600, and 1:800 (for specific values, see Table 1 below).

Similarly, if the detected temperature has risen above the reference temperature, the processing time is shortened so that the etching amount is still E0N. In other words, the processing time is rectified as shown in FIG. 6 and by the following equation:

$$T0R = T0 - t0H \qquad \text{(Equation 2)}$$

where t0H is a predetermined concentration ratio derived by previous experimentation, which gives chemical supply timebands for temperatures above the reference temperature (such as 23° C.), with respect to ratios of HF to distilled water of 1:200, 1:300, 1:400, 1:600, and 1:800 (for specific values, see Table 1).

Therefore, the post-rectification chemical supply time T0R changes depending on the processing temperature, the concentration of DHF and the pre-rectification chemical supply time T0 before rectification.

TABLE 1

CHEMICAL SUPPLY TIME RECTIFICATION (sec.)

| DHF concentration ratio  Temp. of processing liquid | 1:200 | 1:300 | 1:400 | 1:600 | 1:800 |
|---|---|---|---|---|---|
| 15.0 | a 15 = 70 | b 15 | c 15 | d 15 | e 15 |
| 16.0 | a 16 | b 16 | c 16 | d 16 | e 16 |
| 17.0 | a 17 | b 17 | c 17 | d 17 | e 17 |
| 18.0 | a 18 | b 18 | c 18 | d 18 | e 18 |
| 19.0 | a 19 | b 19 | c 19 | d 19 | e 19 |
| 20.0 | a 20 | b 20 | c 20 | d 20 | e 20 |
| 21.0 | a 21 = 18 | b 21 | c 21 | d 21 | e 21 |
| 22.0 | a 22 = 9 | b 22 | c 22 | d 22 | e 22 |
| 23.0 | a 23 = 0 | b 23 = 0 | c 23 = 0 | d 23 = 0 | e 23 = 0 |
| 24.0 | a 24 = 9 | b 24 | c 24 | d 24 | e 24 |
| 25.0 | a 25 | b 25 | c 25 | d 25 | e 25 |
| 26.0 | a 26 | b 26 | c 26 | d 26 | e 26 |
| 27.0 | a 27 | b 27 | c 27 | d 27 | e 27 |
| 28.0 | a 28 | b 28 | a 28 | d 28 | e 28 |

TABLE 1-continued

CHEMICAL SUPPLY TIME RECTIFICATION (sec.)

| DHF concentration ratio<br>Temp. of processing liquid | 1:200 | 1:300 | 1:400 | 1:600 | 1:800 |
|---|---|---|---|---|---|
| 29.0 | a 29 | b 29 | c 29 | d 29 | e 29 |
| 30.0 | a 30 | b 30 | c 30 | d 30 | e 30 | a indicates (1:200)
b indicates (1:300)
c indicates (1:400)
d indicates (1:600)
e indicates (1:800)

During the chemical supply timeband, the concentration of the processing liquid rises together with the start of supply of the chemical into the processing tank, but this will reach a saturation near the end of the supply time, and there is a timeband during which the concentration is constant. One point that requires consideration in this case is that the chemical supply time T0 must be long enough that no problem occurs if part of the end of the chemical supply time T0 is cut to shorten the chemical supply timeband, if the detected temperature is higher than the reference temperature. In other words, the concentration must be constant at the end of the chemical supply, even if the chemical supply time T0 is cut. The condition of Equation 3 is therefore necessary:

$T0 \geq$ (time until the concentration becomes constant)+{chemical supply time (shortened)to}(Max.)    (Equation 3)

However, if the configuration is such that the reference chemical supply time T0 can be set freely, the value given in Table 1 (rectification time t0) can become infinitely large, making data processing impossible, so that the setting of the chemical supply time T0 is fixed at a value such as T0 is 5 (minutes) and thus it is not possible to input the reference chemical supply time T0 as specified by a recipe.

In addition, the etching amount is related to the concentration of the processing liquid, so the DHF concentration must be determined while the etching amount of the wafer W to be processed is compared with the etching amount with respect to the DHF concentration, shown in Table 2.

TABLE 2

| DHF Concentration Ratio | Etching Amount (in Angstroms) |
|---|---|
| 1:200 | 48.16 |
| 1:300 | 24.15 |
| 1:400 | 13.46 |
| 1:600 | 5.55 |
| 1:800 | 2.78 |

Figure 7:
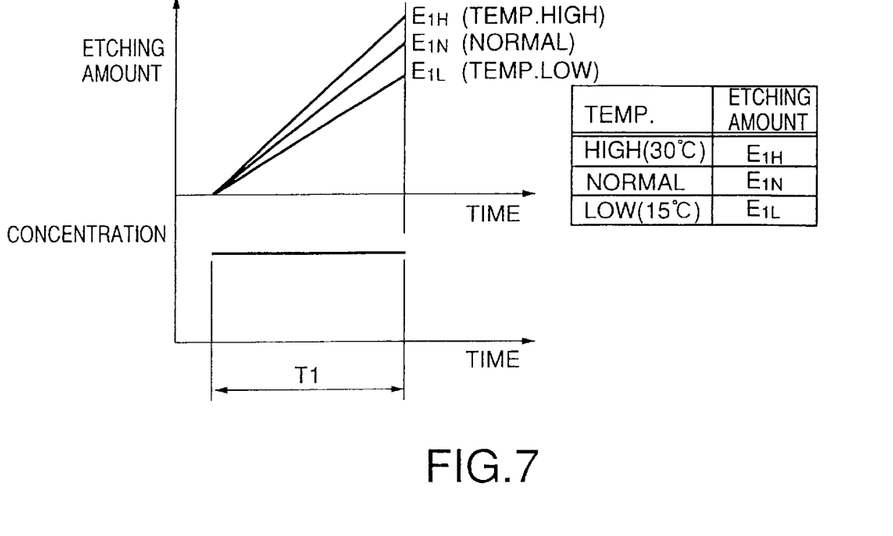
FIG. 7 is a graph of the relationships between etching amount, processing liquid concentration, and time, when no temperature-related rectification is performed for the stabilized concentration timeband.

(2) Rectification of Stabilized Concentration Timeband If there is no such temperature rectification, variations will occur in the etching amount, as shown by E1H to E1L in FIG. 7. Thus, if a reference temperature (such as 23° C.) is taken as normal and the etching amount at this reference temperature is assumed to be E1N, the rectification is performed such that the etching amount is always E1N, regardless of the actual temperature.

Therefore, if the temperature has changed, the rectification is perfomed such that the etching amount is E1N. In other words, the rectification time to ensure that the concentration is constant can be expressed by the following equation:

$T1R = k \times T1$    (Equation 4)

where T1R is the post-rectification stabilized concentration timeband, T1 is the pre-rectification processing time for the stabilized concentration timeband (can be set as required by the operator), and k is a rectification coefficient dependent on predetermined concentrations and temperatures derived previously by experimentation (see Table 3).

TABLE 3

RECTIFICATION COEFFICIENT (k)

| DHF concentration ratio<br>Temp. of processing liquid | 1:200 | 1:300 | 1:400 | 1:600 | 1:800 |
|---|---|---|---|---|---|
| 15.0 | a 15 = 1.74 | b 15 | c 15 | d 15 | e 15 |
| 16.0 | a 16 | b 16 | c 16 | d 16 | e 16 |
| 17.0 | a 17 | b 17 | c 17 | d 17 | e 17 |
| 18.0 | a 18 | b 18 | c 18 | d 18 | e 18 |
| 19.0 | a 19 | b 19 | c 19 | d 19 | e 19 |
| 20.0 | a 20 | b 20 | c 20 | d 20 | e 20 |
| 21.0 | a 21 = 1.12 | b 21 | c 21 | d 21 | e 21 |
| 22.0 | a 22 = 1.06 | b 22 | c 22 | d 22 | e 22 |
| 23.0 | a 23 = 1.00 | b 23 = 1.00 | c 23 = 1.00 | d 23 = 1.00 | e 23 = 1.00 |
| 24.0 | a 24 = 0.95 | b 24 | c 24 | d 24 | e 24 |
| 25.0 | a 25 | b 25 | c 25 | d 25 | e 25 |
| 26.0 | a 26 | b 26 | c 26 | d 26 | e 26 |
| 27.0 | a 27 | b 27 | c 27 | d 27 | e 27 |

TABLE 3-continued

RECTIFICATION COEFFICIENT (k)

| DHF concentration ratio Temp. of processing liquid | 1:200 | 1:300 | 1:400 | 1:600 | 1:800 |
|---|---|---|---|---|---|
| 28.0 | a 28 | b 28 | c 28 | d 28 | e 28 |
| 29.0 | a 29 | b 29 | c 29 | d 29 | e 29 |
| 30.0 | a 30 | b 30 | c 30 | d 30 | e 30 | a indicates (1:200)
b indicates (1:300)
c indicates (1:400)
d indicates (1:600)
e indicates (1:800)

Figure 8:
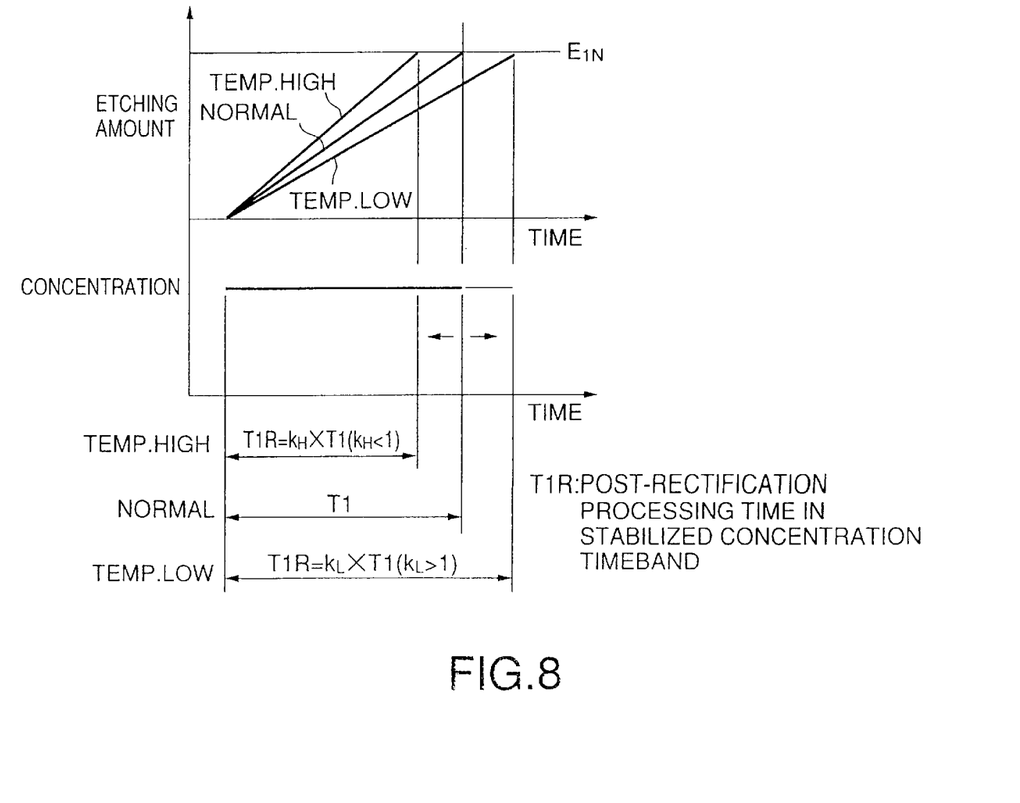
FIG. 8 is a graph of the relationships between etching amount, processing liquid concentration, and time, to illustrate rectification of the stabilized concentration timeband.

Thus, if the detected temperature has fallen below the reference temperature as indicated in FIG. 8, $T1R=kL \times T1$ (where kL is greater than 1) is used to extend the processing time of the stabilized concentration timeband. Similarly, if the detected temperature has risen above the reference temperature, $T1R=kH \times T1$ (where kH is less than 1) is used to shorten the processing time of the stabilized concentration timeband.

Performing both the rectification of the chemical supply timeband of (1) above and the rectification of the stabilized concentration timeband of (2) above makes it possible to clean the wafer W within the optimum processing time. In other words, it is possible to achieve the optimum etching amount based on the temperatures of the cleaning liquid and the distilled water, by rectifying the chemical supply timeband of (1) above and also rectifying the stabilized concentration timeband of (2) above.

Therefore, if the detected temperature has fallen below the reference temperature, the rectified time for the stabilized concentration timeband is given by adding Equation 1 and Equation 4, as follows:

$$T0R+T1R=(T0+toL)+(kL \times T1) \text{ (where } kL>1) \quad \text{(Equation 5)}$$

Equation 5 can be rewritten as follows:

$$T0R+T1R=T0+(toL+kL \times T1) \quad \text{(Equation 6)}$$

Figure 9:
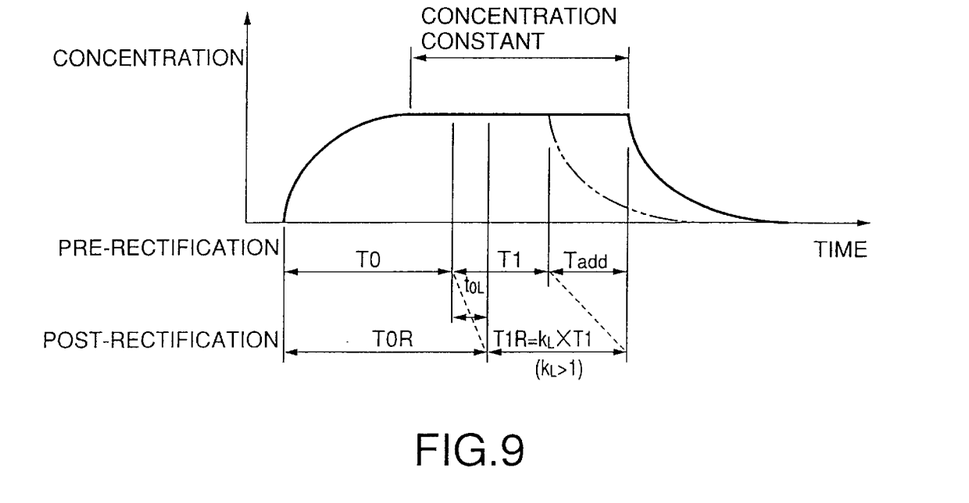
FIG. 9 is a graph of the relationship between processing liquid concentration and time when the detected temperature has fallen below the reference temperature, illustrating the total rectification method of the cleaning method of the present invention.

In this case, T0 is the pre-rectification supply time for the chemical (HF) and $(toL+kL \times T1)$ is the processing time for the portion wherein the concentration is constant, which can be considered to be equivalent to the pre-rectification processing time T1 for the stabilized concentration timeband. If the detected temperature is lower than the reference temperature, therefore, the processing could be performed with the pre-rectification DHF processing time T1 (the stabilized concentration timeband) changed to $(toL+kL \times T1)$, as shown in FIG. 9.

One point that requires consideration in this case is that if the supply of the chemical into the processing tank is to continue while the wafer W is being processed, the chemical within the chemical tank (the HF supply tank 36) might be insufficient. It is therefore necessary in such processing to halt the supply of the chemical into the processing tank 30 before the chemical in the chemical tank becomes insufficient, and perform the processing in a state in which cleaning liquid is accumulated within the processing tank.

If the detected temperature is higher than the reference temperature, on the other hand, Equation 2 and Equation 4 are added together, as follows:

$$T0R+T1R=(T0-toH)+(kH \times T1) \text{ (where } kH<1) \quad \text{(Equation 7)}$$

Equation 7 can be rewritten as follows:

$$T0R+T1R=T0+(-toH+kH \times T1) \quad \text{(Equation 8)}$$

Figure 10:
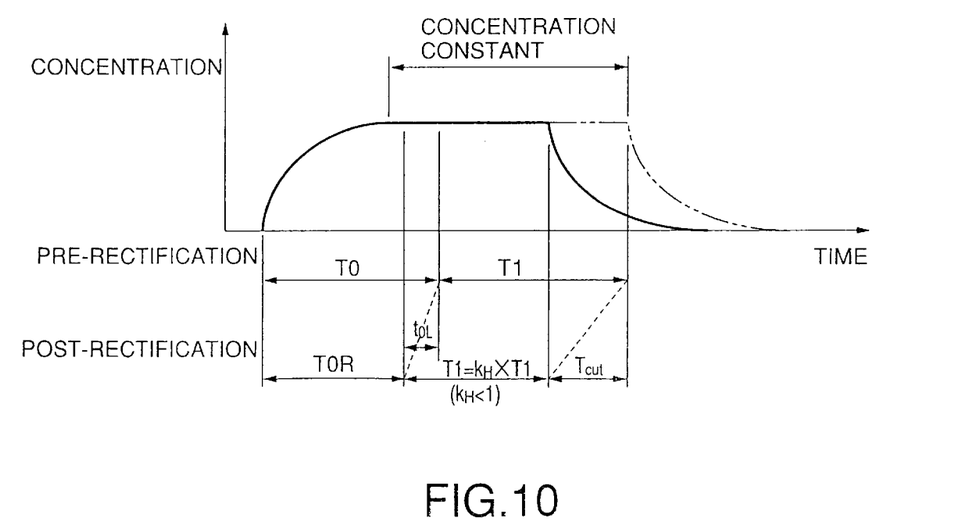
FIG. 10 is a graph of the relationship between processing liquid concentration and time when the detected temperature has risen above the reference temperature, illustrating the total rectification method of the cleaning method of the present invention.

In this case, $(-toH+kH \times T1)$ is the processing time for the portion wherein the concentration is constant, which can be considered to be equivalent to the pre-rectification processing time T1 for the stabilized concentration timeband. If the detected temperature is higher than the reference temperature, therefore, the processing could be performed with the pre-rectification DHF processing time T1 (the stabilized concentration timeband) changed to $(-toH+kH \times T1)$, as shown in FIG. 10. Note that the processing time is shorter in this case, so that the processing time is cut by the amount shown by Tcut in FIG. 10. In other words, the following processing is omitted:

$$Tcut=(T0R+T1R)-(T0+T1)$$

Note also that, if the temperature sensor 39 detects the temperature of the distilled water in this cleaning method, the attachment position thereof could be either on the processing tank 30 as shown in FIG. 2 or on the distilled water supply pipeline 33. In addition, the temperature control range for this cleaning method is described herein as a range of 15° C. to 30° C., but this temperature control range can be set as required.

If the cleaning performed in this cleaning method is done in the sequence of rinsing (distilled water treatment), followed by chemical treatment (DHF treatment), and then rinsing (distilled water treatment), the timing at which the rectification coefficient (k) is determined (the timing of the initial temperature sampling) is from the start of temperature monitoring to the start of chemical (HF) supply (at the start of T0). Furthermore, the timing of the temperature monitoring is monitoring of the temperature for five seconds, by way of example, from a predetermined time before the start of chemical supply to the end of the DHF treatment (at the start of rinsing).

If the cleaning is performed in the sequence of chemical treatment (DHF treatment) then rinsing (distilled water treatment), the timing at which the rectification coefficient (k) is determined (the timing of the initial temperature sampling) is from the start of temperature monitoring until the introduction of the wafer W. In such a case, the entire processing time is rectified by selecting only the rectification coefficient (k) and thus rectifying the processing time for the stabilized concentration timeband alone. The timing of the temperature monitoring is such that the temperature monitoring starts at the point at which the wafer W is introduced to the end of the DHF treatment (at the start of rinsing).

If the temperature should deviate from the temperature control range (such as 15° C. to 30° C.) during the cleaning, it is preferable that the chemical treatment (DHF treatment) is immediately interrupted to switch to rinsing, then the apparatus waits on standby after the rinse. In such a case, it is also preferable that an alarm or the like is output and the introduction of a new lot into the processing tank is prevented. Furthermore, if the temperature should deviate from within +0.5° C. to −0.4° C. of the initial sampled temperature during the processing, it is preferable that the chemical treatment (DHF treatment) is immediately interrupted to switch to rinsing, then the apparatus waits on standby after the rinse. In such a case too, it is preferable that an alarm or the like is output, the introduction of a new lot into the processing tank is prevented, and the current lot is assumed to be abnormally completed (abnormal lot). Note that if the temperature of the processing liquid falls by more than −0.5° C. (if the stipulated etching is not attained), it is preferable that the processing continues by the current lot is assumed to be abnormally completed (abnormal lot). In such a case too, it is preferable that an alarm or the like is output and the introduction of a new lot into the processing tank is prevented.

Other Embodiments

The cleaning apparatus in accordance with the present invention was described in the above embodiment as being applied to the second processing unit 12, but it should be obvious that the cleaning apparatus of this invention can also be applied to the first processing unit 11 and the cleaning/drying unit 13. Furthermore, it is also possible to use it for another type of etching such as etching by tetraetoxysilane (TEOS), by using ammonia water in the processing liquid.

In addition, the cleaning apparatus and cleaning method in accordance with the present invention were described in the above embodiment as being applied to a cleaning system for semiconductor wafers, but this invention can also be applied to other objects to be processed, such as glass substrates for LCDs.

EXAMPLE 3

Favorable results were obtained when the relationship between the temperature of the cleaning liquid and the processing time was as shown in Table 4, during cleaning (etching) in accordance with the above cleaning method.

TABLE 4

| Temperature | Processing time |
| --- | --- |
| Δ+2° C. (27° C.) | −6 sec. (174 sec.) |
| Δ+1° C. (26° C.) | −3 sec. (177 sec.) |
| Basic temp. (For ex. 25° C.) | Basic time (180 sec.) |
| Δ−1° C. (24° C.) | +3 sec. (183 sec.) |
| Δ−2° C. (23° C.) | +6 sec. (186 sec.) |

EXAMPLE 2

Favorable etching was performed when processing was done by the cleaning (etching) of the above described cleaning method, when the cleaning liquid (DHF) was diluted 1:200, the detected temperature of the distilled water was lower than the reference temperature (such as 23° C.) at 21° C., and processing was performed for a processing time (T0R+T1R) obtained by substituting into Equations 5 and 6 the chemical supply rectification time obtained from Table 1 (t0L=a21) of 18 seconds and the rectification coefficient obtained from Table 3 (kL=a21) of 1.12.

Similarly, favorable etching was performed when processing was done when the detected temperature of the distilled water was higher than the reference temperature (such as 23° C.) at 24° C., and processing was performed for a processing time (T0R+T1R) obtained by substituting into Equations 7 and 8 the chemical supply rectification time obtained from Table 1 (t0H=a24) of 5 seconds and the rectification coefficient obtained from Table 3 (kH=a24) of 0.95.

Note that the values of the chemical supply rectification time (t0) and the rectification coefficient (k) for other portions are omitted from Tables 1 and 3, but these omitted values can be obtained by experimentation.

It is clear from the above description that the present invention makes it possible to achieve uniform cleaning of an object to be processed, by detecting the temperature of the cleaning liquid accumulated within the processing tank, setting an immersion time for the object to be processed on the basis of a detected temperature signal or rectifying the processing time of the chemical supply timeband for the cleaning liquid on the basis of the detected temperature signal, and rectifying the processing time of the stabilized concentration timeband. It is therefore possible to achieve uniform processing reactions (such as etching reactions), thus improving the cleaning capability and cleaning precision.

In addition, by using a chemical, a dilute liquid that is a mixture of a chemical and a rinse liquid, or a rinse liquid as the cleaning liquid, it is also possible to rinse the object to be processed within the same processing tank immediately after the chemical, the dilute liquid that is a mixture of the chemical and the rinse liquid, or the rinse liquid has accumulated within the processing tank and the object to be processed has been subjected to a cleaning process therein.

It is also possible to simplify the piping system and also make the entire apparatus more compact, by connecting the chemical supply pipeline to the rinse liquid supply pipeline by a switching means and controlling the switching means on the basis of detection signals from a control means.

What is claimed is:

1. A cleaning method for cleaning an object to be processed, by immersing the object into a cleaning liquid within a processing tank, said cleaning method comprising the steps of:

detecting a temperature of said cleaning liquid in which said object is immersed or to be immersed, and generating a corresponding temperature signal;

determining in immersion time for the immersion of said object in said cleaning liquid, based on said temperature signal;

rectifying said immersion time to be shorter than a reference immersion time if the detected temperature of said cleaning liquid is higher than a reference temperature;

rectifying said immersion time to be longer than a reference immersion time if the detected temperature of said cleaning liquid is lower than the reference temperature; and immersing said object in said cleaning liquid, for said rectified immersion time.

2. The cleaning method as defined in claim 1, wherein: said cleaning liquid is one of a chemical, a mixture of a chemical and a rinse liquid, and a rinse liquid.

3. The cleaning method as defined in claim 1, wherein:
a cleaning process comprises a chemical treatment on the object within the processing tank and an immediately subsequent rinse treatment on said object.

4. A cleaning method for cleaning an object to be processed, by immersing the object into a cleaning liquid within a processing tank, said cleaning method comprising a chemical supply timeband during which a chemical is supplied into said processing tank to gradually increase a concentration of said chemical in said cleaning liquid and an immediately subsequent stabilized concentration timeband; wherein said cleaning method comprises the steps of:

detecting a temperature of said cleaning liquid in which said object is immersed or to be immersed, and generating a corresponding temperature signal;

rectifying a length of said chemical supply timeband, based on said temperature signal; and immersing said object in said cleaning liquid, for an immersion time that comprises said rectified chemical supply timeband length.

5. The cleaning method as defined in claim 4, further comprising the steps of:

pre-determining rectification times in accordance with a concentration ratio of a processing liquid, for each of a temperature that is greater than a reference temperature for said processing liquid and a temperature that is less than said reference temperature; and rectifying the length of said chemical supply timeband based on said temperature signal by subtracting said rectification time from a reference time for a temperature that is greater than said reference temperature, or adding said rectification time to said reference time for a time that is less than said reference temperature.

6. The cleaning method as defined in claim 4, wherein:
said cleaning liquid is one of a chemical, a mixture of a chemical and a rinse liquid, and a rinse liquid.

7. A cleaning method for cleaning an object to be processed, by immersing the object into a cleaning liquid within a processing tank, said cleaning method comprising a chemical supply timeband during which a chemical is supplied into said processing tank to gradually increase a concentration of said chemical in said cleaning liquid and an immediately subsequent stabilized concentration timeband; wherein said cleaning method comprises the steps of:

detecting a temperature of said cleaning liquid in which said object is immersed or to be immersed, and generating a corresponding temperature signal;

rectifying a length of said stabilized concentration timeband, based on said temperature signal; and immersing said object in said cleaning liquid, for an immersion time that comprises said rectified stabilized concentration timeband length.

8. The cleaning method as defined in claim 7, further comprising the steps of:

pre-determining rectification coefficients in accordance with the concentration ratio of a processing liquid, for each temperature of said processing liquid; and rectifying the length of said stabilized concentration timeband by multiplying a reference time for said stabilized concentration timeband by said rectification coefficient.

9. The cleaning method as defined in claim 7, wherein:
said cleaning liquid is one of a chemical, a mixture of a chemical and a rinse liquid, and a rinse liquid.

10. A cleaning method for cleaning an object to be processed, by immersing the object into a cleaning liquid within a processing tank, said cleaning method comprising a chemical supply timeband during which a chemical is supplied into said processing tank to gradually increase a concentration of said chemical in said cleaning liquid and an immediately subsequent stabilized concentration timeband; wherein said cleaning method comprises the steps of:

detecting a temperature of said cleaning liquid in which said object is immersed or to be immersed, and generating a corresponding temperature signal;

pre-determining a rectification time in accordance with a concentration ratio of a processing liquid, for each of a temperature that is greater than a reference temperature for said processing liquid and a temperature that is less than said reference temperature;

rectifying a length of said chemical supply time band by subtracting said rectification time from a reference time for a temperature given by said temperature signal that is greater than said reference time, or adding said rectification time to said reference time for a temperature given by said temperature signal that is less than said reference temperature;

pre-determining a rectification coefficient in accordance with the concentration ratio of said processing liquid, for each temperature of said processing liquid;

rectifying the length of said stabilized concentration timeband by multiplying a reference time for said stabilized concentration timeband by a rectification coefficient corresponding to the temperature given by said temperature signal; and immersing said object in said cleaning liquid, for an immersion time that comprises said rectified chemical supply timeband length and said rectified stabilized concentration timeband length.

11. The cleaning method as defined in claim 10, wherein:
said cleaning liquid is one of a chemical, a mixture of a chemical and a rinse liquid, and a rinse liquid.

12. A cleaning method for cleaning an object to be processed, by immersing the object into a cleaning liquid within a processing tank, said cleaning method comprising the steps of:

detecting a temperature of said cleaning liquid in which said object is immersed or to be immersed, and generating a corresponding temperature signal;

pre-determining rectification coefficients in accordance with a concentration ratio of a processing liquid, for each temperature of said processing liquid;

determining a value of a rectification coefficient, based on said temperature signal;

rectifying an immersion time of said object in the processing liquid, by multiplying a reference time for immersion with said rectification coefficient value; and immersing said object hi said cleaning liquid, for said rectified immersion time.

13. The cleaning method as defined in claim 12, wherein:
said cleaning liquid is one of a chemical, a mixture of a chemical and a rinse liquid, and a rinse liquid.

* * * * *